US007427879B2

(12) United States Patent
Cheng

(10) Patent No.: US 7,427,879 B2
(45) Date of Patent: Sep. 23, 2008

(54) FREQUENCY DETECTOR UTILIZING PULSE GENERATOR, AND METHOD THEREOF

(75) Inventor: Wen-Chang Cheng, Tao-Yuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 56 days.

(21) Appl. No.: 11/562,415

(22) Filed: Nov. 22, 2006

(65) Prior Publication Data
US 2008/0122492 A1 May 29, 2008

(30) Foreign Application Priority Data
Sep. 7, 2006 (TW) .............................. 95133058 A

(51) Int. Cl.
*H03K 9/06* (2006.01)
(52) U.S. Cl. .................... 327/47; 327/291; 327/293; 327/294; 327/299; 327/39; 327/49
(58) Field of Classification Search ......... 327/291–299, 327/39, 47, 49
See application file for complete search history.

(56) References Cited
U.S. PATENT DOCUMENTS
4,277,693 A * 7/1981 Hoekman ................... 307/141

| 5,243,637 | A | * | 9/1993 | Flaherty et al. ............... 377/95 |
| 5,539,337 | A | * | 7/1996 | Taylor et al. .................. 326/94 |
| 6,456,146 | B1 | * | 9/2002 | Darmon et al. ............. 327/407 |
| 6,822,497 | B1 | * | 11/2004 | Yao et al. .................... 327/291 |
| 2006/0044037 | A1 | * | 3/2006 | Gomm et al. ............... 327/261 |
| 2006/0214738 | A1 | * | 9/2006 | Sheng et al. .............. 331/36 C |

* cited by examiner

*Primary Examiner*—Kenneth B. Wells
*Assistant Examiner*—Brandon S Cole
(74) *Attorney, Agent, or Firm*—Winston Hsu

(57) ABSTRACT

The present invention discloses a frequency detecting apparatus for detecting a frequency of an input clock. The frequency detecting apparatus includes: a pulse generator, a digital signal generator, and a decoder. The pulse generator is coupled to the input clock for extracting a period of the input clock to generate a pulse, and the digital signal generator is coupled to the pulse generator for converting the pulse into a plurality of logic values. The digital signal generator includes: a delay module coupled to the pulse, for delaying the pulse to generate a plurality of delayed pulses according to a plurality of delay amounts, respectively; and a sampling module coupled to the delay module for sampling the pulse to generate the logic values according to the delayed pulses, respectively. The decoder is coupled to the digital signal generator for determining the frequency of the input clock according to the logic values.

20 Claims, 4 Drawing Sheets

FREQUENCY DETECTOR UTILIZING PULSE GENERATOR, AND METHOD THEREOF

BACKGROUND OF THE INVENTION

1. Field of the Invention

The method relates to a frequency detecting mechanism, and more particularly to a device having a frequency detector to detect frequencies and a method thereof.

2. Description of the Prior Art

Nowadays, electronic systems are getting more and more complicated. Electronic systems consist of many sub-electronic devices, in which each of the sub-electronic devices may operate at different operating frequencies. Furthermore, the operating frequency of a sub-electronic device may vary in accordance with the operating process of the electronic system, thus the role of a frequency detector becomes more important. On the other hand, the operating frequency of the electronic system is also getting faster in order to conform to a particular requirement, the resolution of the frequency detector must also be higher. In the prior art, a frequency detector having a high resolution but a simple configuration has not been attained. In other words, the prior art frequency detector is only able to discriminate a generally high frequency clock or a low frequency clock, but not able to detect a precise frequency value. Therefore, a frequency detector with simple configuration having wide bandwidth detection abilities is a goal of recent development.

The problem of the prior art is described more clearly in the following description. Normally, when a microprocessor is ready to access a memory, the microprocessor transmits a reading signal to the control circuit of the memory, wherein the reading signal is synchronized with an external clock. In addition, according to prior art, a latency counter is coupled between the microprocessor and the control circuit, for providing a delay time (delay clock period number) to the reading signal in order to guarantee that there is enough time for the memory to access the specific address. However, because of the wide operating frequency range of the memory, the latency counter needs to have a different delay clock period number at a high operating frequency from that at a low operating frequency.

In other words, when operating at a high operating frequency, the delay clock period number should be larger, but when operating at the low operating frequency, the delay clock period number should be smaller. However, the intrinsic delay of the circuit will affect the synchronization between the external clock and the reading signal. In other words, when operating at the high operating frequency, the intrinsic delay of the circuit may be higher than the clock period of the high operating frequency; thus the latency counter may output an error latency delay when the reading signal has slight non-synchronicity with the external clock, and the control circuit will read the error signal consequently.

SUMMARY OF THE INVENTION

One of the objectives of the present invention is to provide a pulse generator, a frequency detector having the pulse generator and method thereof, to solve the above mentioned problem.

According to an embodiment of the present invention, a frequency detecting apparatus is disclosed for detecting a frequency of an input clock. The frequency detecting apparatus comprises a pulse generator, a digital signal generator, and a decoder. The pulse generator is coupled to the input clock for extracting one period of the input clock to generate a pulse; the digital signal generator is coupled to the pulse generator for converting the pulse into a plurality of logic values. The digital signal generator includes: a delay module coupled to the pulse, for delaying the pulse to generate a plurality of delayed pulses according to a plurality of delay amounts, respectively; and a sampling module coupled to the delay module for sampling the pulse to generate the logic values according to the delayed pulses, respectively. The decoder is coupled to the digital signal generator for determining the frequency of the input clock according to the logic values.

According to a second embodiment of the present invention, a pulse generator is disclosed. The pulse generator is coupled to a reset signal, and comprises a one period impulse generating unit, an activating apparatus, a trigger signal generating apparatus, and a latching apparatus. The one period impulse generating unit is coupled to an input clock for generating an impulse signal in each period of the input clock; the activating apparatus is coupled to the one period impulse generating unit for activating the pulse generator according to the reset signal, and for generating a first signal and a second signal according to the impulse signal; the trigger signal generating apparatus is coupled to the activating apparatus, for generating a first triggering signal and a second triggering signal according to the first and second signal, respectively, wherein the timing between the first and second triggering signal is one period of the input clock; and the latching apparatus coupled to the trigger signal generating apparatus for latching the pulse according to the first and second triggering signal.

According to a third embodiment of the present invention, a frequency detecting method is disclosed for detecting a frequency of an input clock. The method comprises the steps of extracting one period of the input clock to generate a pulse; converting the pulse into a plurality of logic values, which comprises the steps of delaying the pulse to generate a plurality of delayed pulses according to a plurality of delay amounts, respectively; and sampling the pulse to generate the logic values according to the delayed pulses, respectively; and determining the frequency of the input clock according to the logic values.

According to a third embodiment of the present invention, a pulse generating method is disclosed for generating a pulse of one period of an input clock. The method comprises the steps of generating an impulse signal in each period of the input clock; generating a first signal and a second signal according to the impulse signal and a reset signal; generating a first triggering signal and a second triggering signal according to the first and second signal respectively, wherein the timing between the first and second triggering signal is one period of the input clock; and latching the pulse according to the first and second triggering signal.

These and other objectives of the present invention will no doubt become obvious to those of ordinary skill in the art after reading the following detailed description of the preferred embodiment that is illustrated in the various figures and drawings.

DETAILED DESCRIPTION

Therefore, in order to solve the above mentioned problem, a latency counter having a frequency detector is provided that can detect the operating frequency of the memory, where the delay time of the latency counter can be adjusted according to the result of the frequency detector.

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
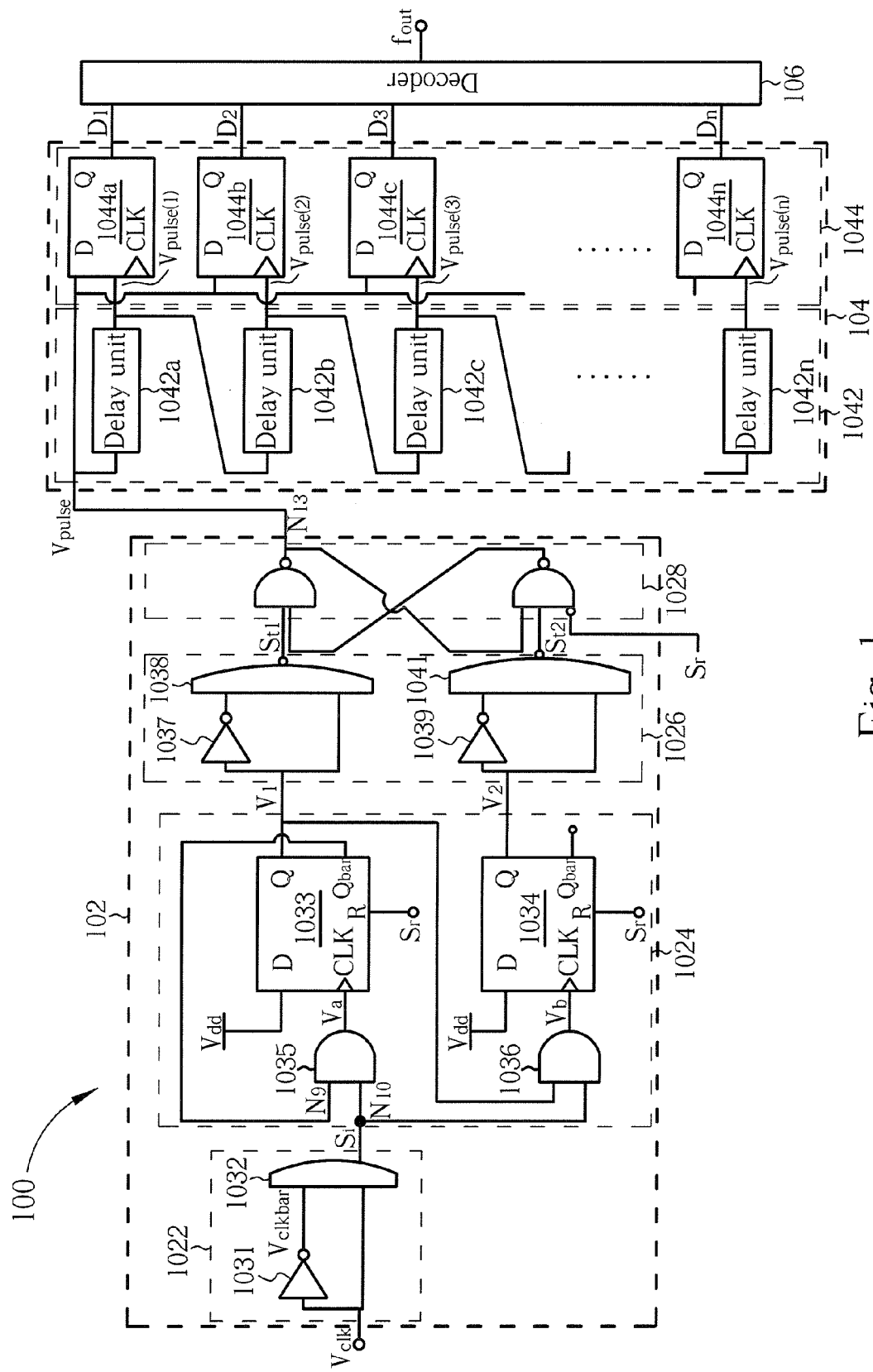
FIG. 1 is a diagram illustrating a frequency detecting apparatus according to an embodiment of the present invention.

Please refer to FIG. 1. FIG. 1 is a diagram illustrating a frequency detecting apparatus 100 according to an embodiment of the present invention. The frequency detecting apparatus 100 is utilized for detecting a frequency $f_{out}$ of an input clock $V_{clk}$, such as the operating frequency of a memory. In this embodiment, the frequency detecting apparatus 100 comprises a pulse generator 102, a digital signal generator 104, and a decoder 106. The pulse generator 102 coupled to the input clock $V_{clk}$ for extracting one period T of the input clock $V_{clk}$ to generate a pulse $V_{pulse}$. The digital signal generator 104 is coupled to the pulse generator 102 for converting the pulse $V_{pulse}$ into a plurality of logic values $D_1 \sim D_n$, as shown in FIG. 1. The digital signal generator 104 further comprises a delay module 1042 coupled to the pulse $V_{pulse}$ for delaying the pulse $V_{pulse}$ to generate a plurality of delayed pulses $V_{pulse(1)} \sim V_{pulse(n)}$ according to a plurality of delay units 1042a~1042n, respectively (In this embodiment, each of the delay unit 1042a~1042n generates an unit delay amount $D_{unit}$). Furthermore, the digital signal generator 104 comprises a sampling module 1044 coupled to the delay module 1042 for sampling the pulse $V_{pulse}$ to generate the logic values $D_1 \sim D_n$ according to the delayed pulses $V_{pulse(1)} \sim V_{pulse(n)}$, respectively. The decoder 106 coupled to the digital signal generator 104 for determining the frequency $f_{out}$ of the input clock $V_{clk}$ according to the logic values $D_1 \sim D_n$.

Please note that, in this embodiment, the delay module 1042 of the digital signal generator 104 comprises the delay units 1042a~1042n, which are series connected with each other, for generating each of the delayed pulses $V_{pulse(1)} \sim V_{pulse(n)}$ at output terminals of the delay units 1042a~1042n, respectively. The sampling module 1044 comprises a plurality of registering devices 1044a~1044n (e.g. flip-flops) for reading the pulse $V_{pulse}$ to generate each of the logic values $D_1 \sim D_n$ according to the triggering of each of the delayed pulses $V_{pulse(1)} \sim V_{pulse(n)}$, respectively. However, the embodiment in FIG. 1 is not meant to be a limitation of the present invention. For example, the registering devices 1044a~1044n can also be implemented by other devices.

On the other hand, the pulse generator 102 of the frequency detecting apparatus 100 further coupled to a reset signal $S_r$, wherein if the pulse generator 102 receives the reset signal $S_r$, the pulse generator 102 is reset and re-extracting one period of the input clock $V_{clk}$. According to FIG. 1, the pulse generator 102 comprises a period impulse generating unit 1022 coupled to the input clock $V_{clk}$ for generating an impulse signal $S_i$ in each period of the input clock $V_{clk}$; an activating apparatus 1024 coupled to the one period impulse generating unit 1022 for activating the pulse generator 102 according to the reset signal $S_r$, and for generating a first signal $V_1$ and a second signal $V_2$ according to the impulse signal $S_i$; a trigger signal generating apparatus 1026 coupled to the activating apparatus 1024 for generating a first triggering signal $S_{t1}$ and a second triggering signal $S_{t2}$ according to the first and second signal $V_1$, $V_2$ respectively. The timing between the first and second triggering signal $S_{t1}$, $S_{t2}$ is one period T of the input clock $V_{clk}$, and a latching apparatus 1028 coupled to the trigger signal generating apparatus 1026 for latching the pulse $V_{pulse}$ according to the first and second triggering signal $S_{t1}$, $S_{t2}$. Furthermore, the inverse signal of the reset signal $S_r$ also coupled to the latching apparatus 1028. In this embodiment, the one period impulse generating unit 1022 comprises an delay inverter 1031 for inverting the input clock $V_{clk}$ to generate an inverse input clock $V_{clkbar}$, and an AND gate 1032 coupled to the delay inverter 1031 and the input clock $V_{clk}$ is for generating the impulse signal $S_i$ according to the input clock $V_{clk}$ and the inverse input clock $V_{clkbar}$. The activating apparatus 1024 comprises a first flip-flop 1033 having a data terminal D coupled to a supply voltage $V_{dd}$, which is a reference logic value of "1", and a non-inverting output terminal Q generates the first signal $V_1$. A second flip-flop 1034 having a data terminal D coupled to the supply voltage $V_{dd}$, which is the reference logic value of "1", and a non-inverting output terminal Q generates the second signal $V_1$. A first AND gate 1035 having two input terminals $N_9$, $N_{10}$ is coupled to the impulse signal $S_i$ and an inverting output terminal $Q_{bar}$ of the first flip-flop 1033 respectively, having an output terminal coupled to a clock terminal CLK of the first flip-flop 1033. A second AND gate 1036 having two input terminals $N_{11}$, $N_{12}$ coupled to the impulse signal $S_i$ and the first signal $V_1$ respectively, and having an output terminal coupled to a clock terminal CLK of the second flip-flop 1034.

The trigger signal generating apparatus 1026 comprises a first inverter 1037 coupled to the first signal $V_1$ for inverting the first signal $V_1$ to generate a first inverse signal $V_{1bar}$. A first NAND gate 1038 is coupled to the first delay inverter 1037 and the first signal $V_1$ for generating the first triggering signal $S_{t1}$ according to the first signal $V_1$ and the first inverse signal $V_{1bar}$. A second delay inverter 1039 is coupled to the second signal $V_2$ for inverting the second signal $V_2$ to generate a second inverse signal $V_{2bar}$. A second NAND gate 1041 is coupled to the second delay inverter 1039 and the second signal $V_2$ for generating the second triggering signal $S_{t2}$ according to the second signal $V_2$ and the second inverse signal $V_{2bar}$. Please note that, the delay inverter of the present invention not only provides the function of inverting a signal, the delay inverter further provides a delay amount upon the output signal.

Figure 2:
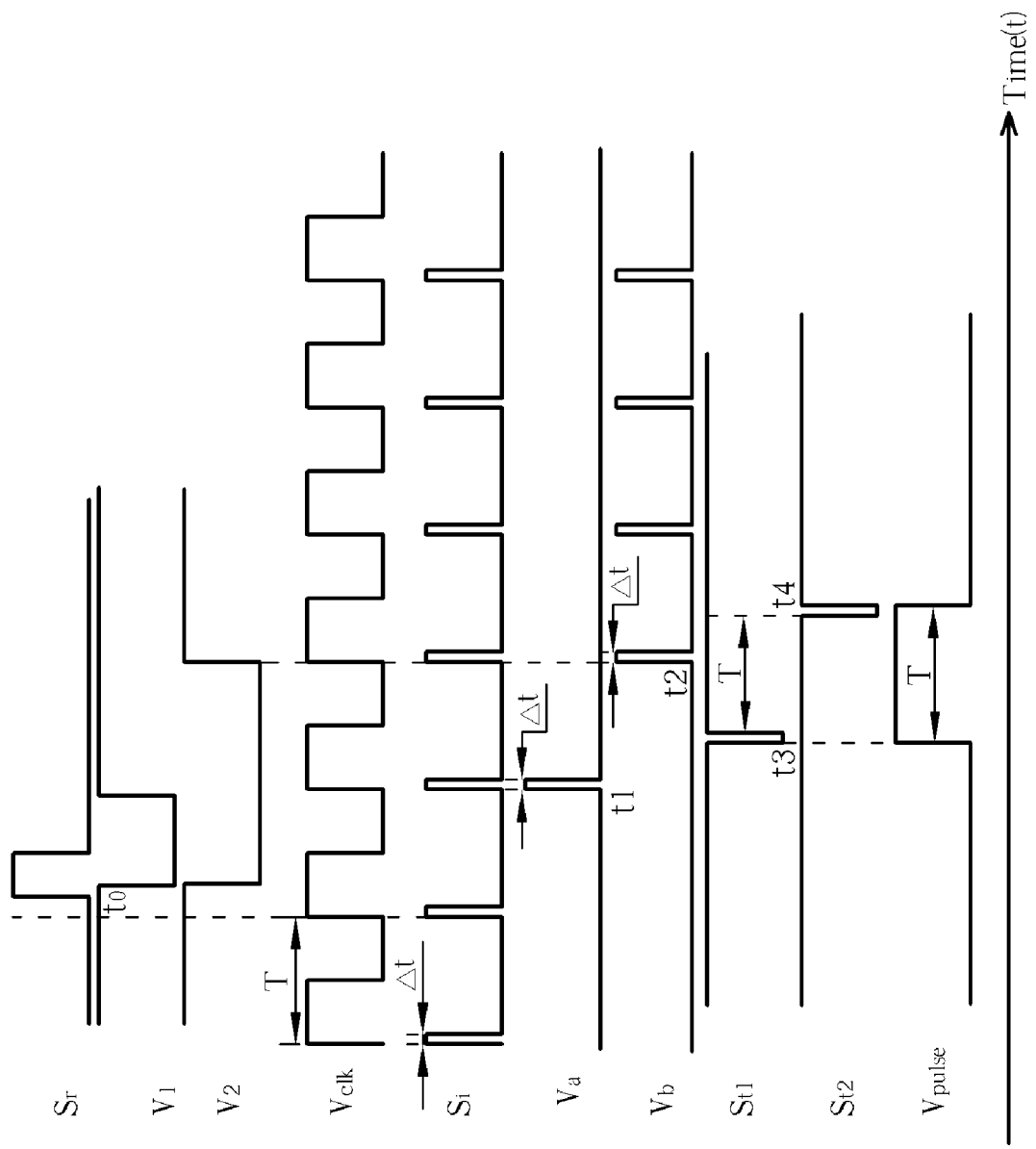
FIG. 2 is a timing diagram illustrating the operation of the frequency detecting apparatus of FIG. 1.

Please note that, in order to describe the concepts of the present invention more clearly, the frequency $f_{out}$ of the input clock $V_{clk}$ is set to 1 GHz for illustrative purposes. Please refer to FIG. 1 in conjunction with FIG. 2. FIG. 2 is a timing diagram illustrating the operation of the frequency detecting apparatus 100 of FIG. 1. According to FIG. 2, the first and second signal $V_1$, $V_2$ are in the high voltage level initially, which means that the reset signal $S_r$ is in the low voltage level), and the pulse $V_{pulse}$ is in the low voltage level. Meanwhile, the impulse signal $S_i$ is constantly being generated in each clock period T of the input clock $V_{clk}$, as shown in FIG. 2. When a pulse of the reset signal $S_r$ is inputted at time $t_0$, the first and the second signal $V_1$, $V_2$ switch to the low voltage level, and a signal $V_a$ is generated at the output terminal (clock terminal CLK) of the AND gate 1035 at time $t_1$, which will switch the first signal $V_1$ outputted at the non-inverting output terminal Q (reference logic value $V_{dd}$) into high voltage level. In the meantime, the high voltage level of the first signal $V_1$ will trigger the second AND gate 1036 to generate a signal $V_b$ at the clock terminal CLK at time $t_2$. Therefore, the second signal $V_2$ outputted at the non-inverting output terminal Q switches into the high voltage level (supply voltage $V_{dd}$). Accordingly, the switching time difference between the first signal $V_1$ and the second signal $V_2$ is a clock period T of the input clock $V_{clk}$, which is 1 nS in this example. Please note that, the inverter 1031 of the one period impulse generating unit 1022 in the present invention not only inverses the input clock $V_{clk}$ to generate the inverse input clock $V_{clkbar}$, the inverter 1031 further provides a delay amount $\Delta t$ upon the input clock $V_{clk}$. However, the delay amount $\Delta t$ is designed to be much smaller than the clock period T (1 nS) of the input clock $V_{clk}$ in this embodiment, which does not affect normal operation in this embodiment.

According to FIG. 2, when the high voltage level of the first signal $V_1$ and the high voltage level of the second signal $V_2$ are transmitted to the trigger signal generating apparatus 1026 successively, the first triggering signal $S_{t1}$ and the second triggering signal $S_{t2}$ are generated at time $t_3$ and $t_4$, respectively. Similarly, the time difference of time $t_3$ and $t_4$ is 1 nS. Because the operation of the trigger signal generating apparatus 1026 is same as the one period impulse generating unit 1022, further detailed description of the trigger signal generating apparatus 1026 is hence omitted for brevity. Furthermore, because the initial value at the output terminal $N_{13}$ of the latching apparatus 1028 is at a low voltage level, and with reference to the operation of the latching apparatus 1028, the high voltage level of the first signal $V_1$ will switch the voltage at the output terminal $N_{13}$ from the low voltage level into the high voltage level at time $t_3$. Then, the high voltage level of the second signal $V_2$ will switch the voltage at the output terminal $N_{13}$ from the high voltage level into the low voltage level at time $t_4$. Therefore, the pulse $V_{pulse}$ that having the period T of the input clock $V_{clk}$ is generated, as shown in FIG. 2.

Figure 3:
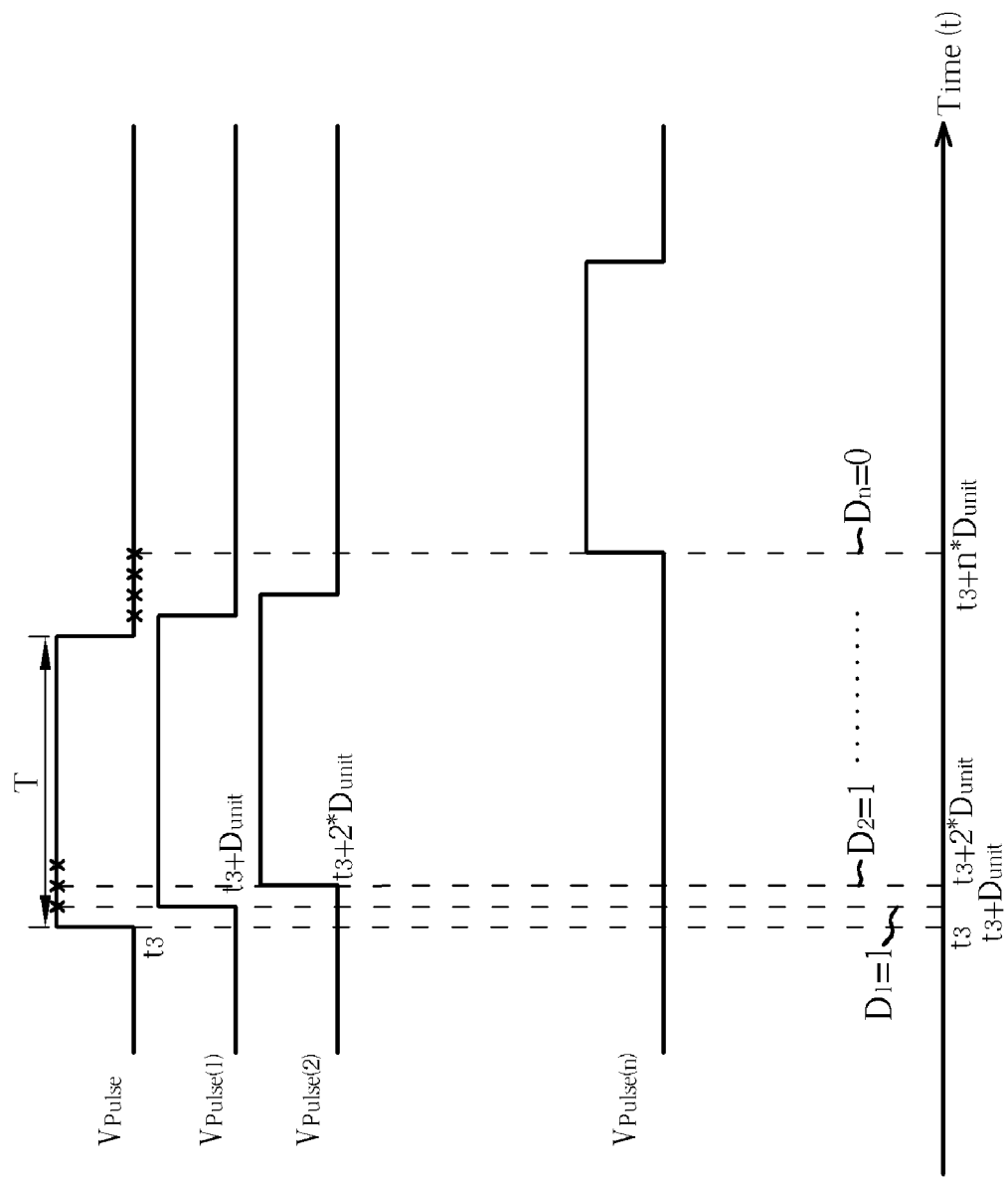
FIG. 3 is a timing diagram illustrating the operation of sampling the pulse by the frequency detecting apparatus in FIG. 1.

Please refer to FIG. 1, FIG. 2, and FIG. 3 concurrently. FIG. 3 is a timing diagram illustrating the operation of sampling the pulse $V_{pulse}$ with the frequency detecting apparatus 100 in FIG. 1. Ideally, when the pulse $V_{pulse}$ is transmitted to the digital signal generator 104 and the decoder 106, the data terminal D of each of the registering device 1044a~1044n receives the pulse $V_{pulse}$ at time $t_3$ simultaneously. However, the delay unit 1042a~1042n will result the delayed pulses $V_{pulse(1)}~V_{pulse(n)}$ that are received at the clock terminal CLK of each of the registering devices 1044a~1044n at different times, which is $t_3+D_{unit}$, $t_3+2*D_{unit}$, ..., $t_3+n*D_{unit}$, respectively. Therefore, the delay units 1042a~1042n are triggered at times $t_3+D_{unit}$, $t_3+2*D_{unit}$, ..., $t_3+n*D_{unit}$, respectively. Because the high voltage level of the pulse Vpulse only appears at the time within the period T, which means that each of the registering device 1044a~1044n are outputting the high voltage level (logic value of "1") in the time interval of $t_3$ to $t_3+T$, the delay unit trigger within the time interval of $t_3$ to $t_3+T$ will output the high voltage level, and others will output the low voltage level. Therefore all of the logic values $D_1~D_n$ will be transmitted to the decoder 106, and the decoder 106 will generate the frequency $f_{out}$ of the input clock $V_{clk}$ according to the logic values $D_1~D_n$. Please note that operation of decoding the logic values $D_1~D_n$ for generating the frequency $f_{out}$ of the input clock $V_{clk}$ is described and performed in the prior art, and therefore a detailed description is omitted here for brevity. According to the above mentioned disclosure, the unit delay amount $D_{unit}$ of each of the delay unit will decide the resolution to detect the frequency $f_{out}$, and total delay amount $n*D_{unit}$ provided by the delay module 1042, such that it cannot be smaller than the clock period T of the input clock $V_{clk}$ in order to obtain the frequency $f_{out}$ of the input clock $V_{clk}$ precisely. In this embodiment, if the frequency $f_{out}$ of the input clock $V_{clk}$ is 1 GHz, then $n*D_{unit}$ has to be larger than 1 nS.

Figure 4:
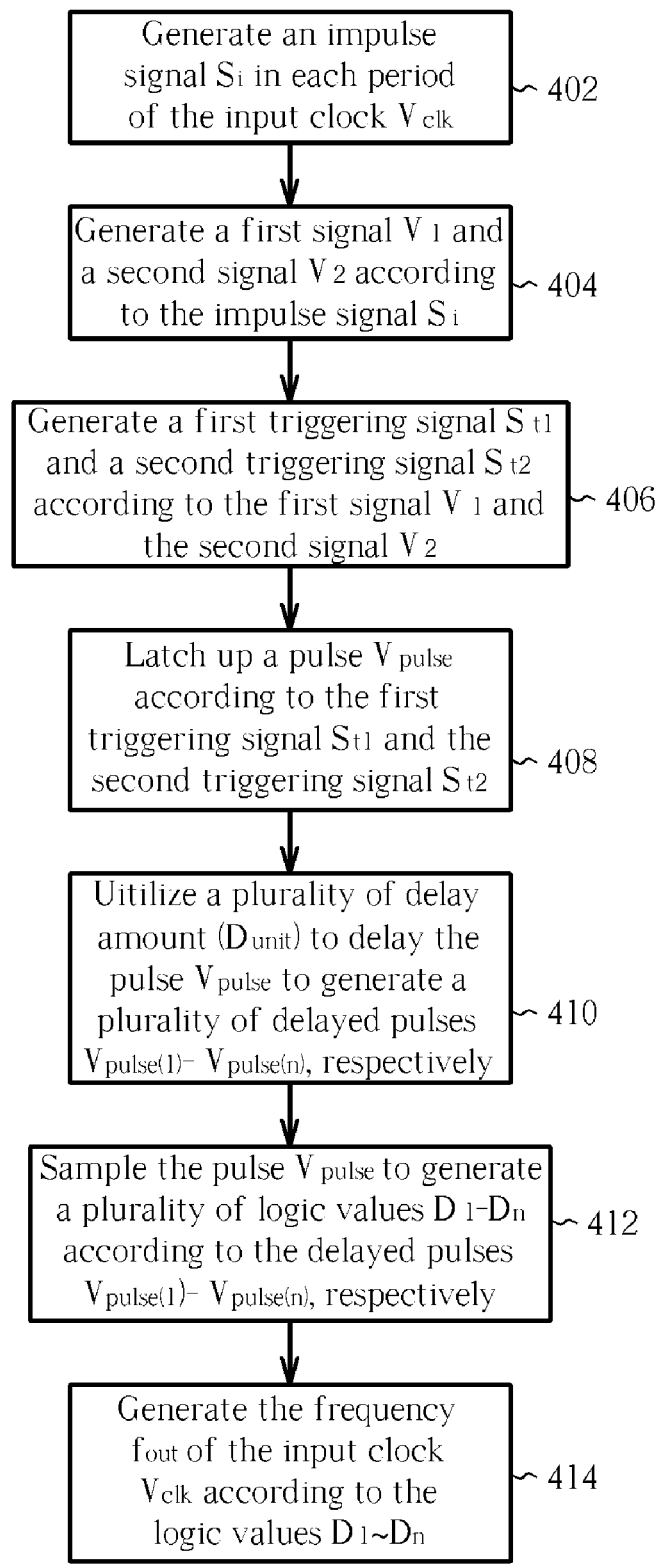
FIG. 4 is a flowchart illustrating a frequency detecting method according to an embodiment of the present invention.

Please refer to FIG. 4. FIG. 4 is a flowchart illustrating a frequency detecting method according to an embodiment of the present invention. The frequency detecting method is utilized in the frequency detecting apparatus 100 of FIG. 1 for detecting a frequency $f_{out}$ of an input clock $V_{clk}$. The steps are described as follows:

Step 402: Generate an impulse signal $S_i$ in each period of the input clock $V_{clk}$;

Step 404: Generate a first signal $V_1$ and a second signal $V_2$ according to the impulse signal $S_i$;

Step 406: Generate a first triggering signal $S_{t1}$ and a second triggering signal $S_{t2}$ according to the first signal $V_1$ and the second signal $V_2$, wherein the timing difference between the first triggering signal $S_{t1}$ and the second triggering signal $S_{t2}$ is a clock period T of the input clock $V_{clk}$;

Step 408: Latch up a pulse $V_{pulse}$ according to the first triggering signal $S_{t1}$ and the second triggering signal $S_{t2}$;

Step 410: Utilize a plurality of delay amount ($D_{unit}$) to delay the pulse $V_{pulse}$ to generate a plurality of delayed pulses $V_{pulse(1)}$-$V_{pulse(n)}$, respectively;

Step 412: Sample the pulse $V_{pulse}$ to generate a plurality of logic values $D_1$-$D_n$ according to the delayed pulses $V_{pulse(1)}$-$V_{pulse(n)}$, respectively; and Step 414: Generate the frequency $f_{out}$ of the input clock $V_{clk}$ according to the logic values $D_1~D_n$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency detecting apparatus for detecting a frequency of an input clock comprising:
    a pulse generator, coupled to the input clock, for extracting one period of the input clock to generate a pulse;
    a digital signal generator, coupled to the pulse generator, for converting the pulse into a plurality of logic values, the digital signal generator comprising:
        a delay module, coupled to the pulse, for delaying the pulse to generate a plurality of delayed pulses according to a plurality of delay amounts, respectively; and
        a sampling module, coupled to the delay module, for sampling the pulse to generate the logic values according to the delayed pulses, respectively; and
    a decoder, coupled to the digital signal generator, for determining the frequency of the input clock according to the logic values.

2. The frequency detecting apparatus of claim 1, wherein the delay module comprises:
    a plurality of delay units, connected in series with each other, for generating the delayed pulses;
    wherein the delay units each provide a predetermined delay value for determining the delay amounts.

3. The frequency detecting apparatus of claim 1, wherein the sampling module comprises:
    a plurality of registering devices, for reading the pulse to generate the logic values according to the triggering of the delayed pulses respectively.

4. The frequency detecting apparatus of claim 2, wherein the pulse generator is further coupled to a reset signal, and the pulse generator comprises:
- a one period impulse generating unit, coupled to the input clock, for generating an impulse signal in each period of the input clock;
- an activating apparatus, coupled to the one period impulse generating unit, for activating the pulse generator according to the reset signal, and for generating a first signal and a second signal according to the impulse signal;
- a trigger signal generating apparatus, coupled to the activating apparatus, for generating a first triggering signal and a second triggering signal according to the first and second signal, respectively, wherein the timing between the first and second triggering signal is one period of the input clock; and
- a latching apparatus, coupled to the trigger signal generating apparatus, for latching the pulse according to the first and second triggering signal.

5. The frequency detecting apparatus of claim 4, wherein the one period impulse generating unit comprises:
- an inverter, for inverting the input clock to generate an inverse input clock; and
- an AND gate, coupled to the inverter input clock and the input clock, for generating the impulse signal according to the input clock and the inverse input clock.

6. The frequency detecting apparatus of claim 4, wherein the activating apparatus comprises:
- a first flip-flop, having a data terminal coupled to a reference logic value, and a non-inverting output terminal outputting the first signal;
- a second flip-flop, having a data terminal coupled to the reference logic value, and a non-inverting output terminal outputting the second signal;
- a first AND gate, having two input terminals coupled to the impulse signal and an inverting output terminal of the first flip-flop respectively, and having an output terminal coupled to a clock terminal of the first flip-flop; and
- a second AND gate, having two input terminals coupled to the impulse signal and the first signal respectively, and having an output terminal coupled to a clock terminal of the second flip-flop.

7. The frequency detecting apparatus of claim 4, wherein the trigger signal generating apparatus comprises:
- a first inverter, coupled to the first signal, for inverting the first signal to generate a first inverse signal;
- a first NAND gate, coupled to the first inverter and the first signal, for generating the first triggering signal according to the first signal and the first inverse signal;
- a second inverter, coupled to the second signal, for inverting the second signal to generate a second inverse signal; and
- a second NAND gate, coupled to the second inverter and the second signal, for generating the second triggering signal according to the second signal and the second inverse signal.

8. The frequency detecting apparatus of claim 1, wherein the maximum delay amount between a delayed pulse that generated by the delay module and the pulse is not less than one period of the input clock.

9. A pulse generator, coupled to a reset signal, comprising:
- a one period impulse generating unit, coupled to an input clock, for generating an impulse signal in each period of the input clock;
- an activating apparatus, coupled to the one period impulse generating unit, for activating the pulse generator according to the reset signal, and for generating a first signal and a second signal according to the impulse signal;
- a trigger signal generating apparatus, coupled to the activating apparatus, for generating a first triggering signal and a second triggering signal according to the first and second signal, respectively, wherein the timing between the first and second triggering signal is one period of the input clock; and
- a latching apparatus, coupled to the trigger signal generating apparatus, for latching the pulse according to the first and second triggering signal.

10. The pulse generator of claim 9, wherein the one period impulse generating unit comprises:
- an inverter, for inverting the input clock to generate an inverse input clock; and
- an AND gate, coupled to the inverter input clock and the input clock, for generating the impulse signal according to the input clock and the inverse input clock.

11. The pulse generator of claim 9, wherein the activating apparatus comprises:
- a first flip-flop, having a data terminal coupled to a reference logic value, and a non-inverting output terminal outputting the first signal;
- a second flip-flop, having a data terminal coupled to the reference logic value, and a non-inverting output terminal outputting the second signal;
- a first AND gate, having two input terminals coupled to the impulse signal and an inverting output terminal of the first flip-flop respectively, and having an output terminal coupled to a clock terminal of the first flip-flop; and
- a second AND gate, having two input terminals coupled to the impulse signal and the first signal respectively, and having an output terminal coupled to a clock terminal of the second flip-flop.

12. The pulse generator of claim 9, wherein the trigger signal generating apparatus comprises:
- a first inverter, coupled to the first signal, for inverting the first signal to generate a first inverse signal;
- a first NAND gate, coupled to the first inverter and the first signal, for generating the first triggering signal according to the first signal and the first inverse signal;
- a second inverter, coupled to the second signal, for inverting the second signal to generate a second inverse signal; and
- a second NAND gate, coupled to the second inverter and the second signal, for generating the second triggering signal according to the second signal and the second inverse signal.

13. A frequency detecting method, for detecting a frequency of an input clock, comprising:
- extracting one period of the input clock to generate a pulse;
- converting the pulse into a plurality of logic values by:
  - delaying the pulse to generate a plurality of delayed pulses according to a plurality of delay amounts, respectively; and
  - sampling the pulse to generate the logic values according to the delayed pulses, respectively; and
- determining the frequency of the input clock according to the logic values.

14. The frequency detecting method of claim 13, wherein the step of delaying the pulse to generate the plurality of delayed pulses comprises:
- utilizing a plurality of delay units, series connected with each other, to generate the delayed pulses;
- wherein the delay units each provide a predetermined delay value for determining the delay amounts.

15. The frequency detecting method of claim 13, wherein the step of sampling the pulse to generate the logic values comprises:
    utilizing a plurality of register devices to read the pulse to generate the logic values according to the triggering of the delayed pulses respectively.

16. The frequency detecting method of claim 14, wherein the step of extracting one period of the input clock to generate the pulse comprises:
    generating an impulse signal in each period of the input clock;
    generating a first signal and a second signal according to the impulse signal and a reset signal;
    generating a first triggering signal and a second triggering signal according to the first and second signal respectively, wherein the timing between the first and second triggering signal is one period of the input clock; and
    latching the pulse according to the first and second triggering signal.

17. The frequency detecting method of claim 14, wherein the step of generating the first triggering signal and the second triggering signal comprises:
    inverting the first signal to generate a first inverse signal;
    generating the first triggering signal according to the first signal and the first inverse signal;
    inverting the second signal to generate a second inverse signal; and
    generating the second triggering signal according to the second signal and the second inverse signal.

18. The frequency detecting method of claim 13, wherein the maximum delay amount between one delayed pulse within the delay pulses and the pulse is not less than one period of the input clock.

19. A pulse generating method, for generating a pulse corresponding one period of an input clock, comprising:
    generating an impulse signal in each period of the input clock;
    generating a first signal and a second signal according to the impulse signal and a reset signal;
    generating a first triggering signal and a second triggering signal according to the first and second signal respectively, wherein the timing between the first and second triggering signal is one period of the input clock; and
    latching the pulse according to the first and second triggering signal.

20. The pulse generating method of claim 19, wherein the step of generating the first triggering signal and the second triggering signal comprises:
    inverting the first signal to generate a first inverse signal;
    generating the first triggering signal according to the first signal and the first inverse signal;
    inverting the second signal to generate a second inverse signal; and
    generating the second triggering signal according to the second signal and the second inverse signal.

* * * * *